(12) United States Patent
Ko et al.

(10) Patent No.: US 11,683,961 B2
(45) Date of Patent: Jun. 20, 2023

(54) TRANSPARENT DISPLAY DEVICE

(71) Applicant: LG Display Co., Ltd., Seoul (KR)

(72) Inventors: Taehee Ko, Paju-si (KR); Sunyoung Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/546,614

(22) Filed: Dec. 9, 2021

(65) Prior Publication Data

US 2022/0190072 A1 Jun. 16, 2022

(30) Foreign Application Priority Data

Dec. 10, 2020 (KR) ........................ 10-2020-0171960

(51) Int. Cl.
  *H10K 59/122* (2023.01)
  *H10K 50/805* (2023.01)
  *H10K 59/35* (2023.01)
(52) U.S. Cl.
  CPC ......... *H10K 59/122* (2023.02); *H10K 50/805* (2023.02); *H10K 59/351* (2023.02)
(58) Field of Classification Search
  CPC ............. H01L 51/5203; H01L 27/3246; H01L 51/5215; H01L 51/5234; H10K 30/82
  See application file for complete search history.

(56) References Cited

U.S. PATENT DOCUMENTS

| | | | |
|---|---|---|---|
| 9,892,672 B2 | 2/2018 | Lee et al. | |
| 11,004,393 B2 | 5/2021 | Woo et al. | |
| 2011/0175097 A1* | 7/2011 | Song | H01L 27/3276 257/59 |
| 2015/0357383 A1* | 12/2015 | Chung | H01L 27/326 257/40 |
| 2016/0178972 A1* | 6/2016 | Lo | G02F 1/1368 257/71 |
| 2017/0213873 A1* | 7/2017 | Bok | H01L 27/3262 |
| 2017/0294488 A1* | 10/2017 | Lin | H01L 27/3262 |

FOREIGN PATENT DOCUMENTS

| KR | 10-2016-0128490 A | 11/2016 |
|---|---|---|
| KR | 10-2019-0033683 A | 4/2019 |

* cited by examiner

*Primary Examiner* — Kevin M Nguyen
(74) *Attorney, Agent, or Firm* — Seed IP Law Group LLP

(57) ABSTRACT

A transparent display device may optimize arrangement areas of a plurality of signal lines and circuit areas, and may prevent a luminance difference from occurring between subpixels for emitting light of the same color. The transparent display device comprises a substrate provided with transmissive areas, a first non-transmissive area provided between the transmissive areas in a first direction, and a second non-transmissive area provided between the transmissive areas in a second direction, first signal lines provided along the first non-transmissive area in the first non-transmissive area and extended from an overlapping area, in which the first non-transmissive area and the second non-transmissive area cross each other, in a direction crossing the first direction, and second signal lines provided along the second non-transmissive area in the second non-transmissive area and extended from the overlapping area in a direction crossing the second direction. Two adjacent first signal lines are symmetrical with each other with the transmissive area interposed therebetween, and two adjacent second signal lines are symmetrical with each other with the transmissive area interposed therebetween.

30 Claims, 6 Drawing Sheets

FIG. 5

|  | DL1 | DL2 | DL3 | DL4 |
|---|---|---|---|---|
| SCANL1 | G | W | G | W |
| SCANL2 | B | R | B | R |
| SCANL3 | G | W | G | W |
| SCANL4 | B | R | B | R |

TRANSPARENT DISPLAY DEVICE

BACKGROUND

Technical Field

The present disclosure relates to a transparent display device.

Description of the Related Art

With advancement in information-oriented societies, demands for display devices that display an image have increased in various forms. Recently, various types of display devices such as a liquid crystal display (LCD) device, a plasma display panel (PDP) device, and an organic light emitting display (OLED) device, a quantum dot light emitting display (QLED) device have been widely utilized.

Recent, studies for transparent display devices for allowing a user to look at objects or image arranged on an opposite side of a display device after transmitting the display device are actively ongoing.

BRIEF SUMMARY

A transparent display device may have high light transmittance in a display area through a transmissive area. However, the transparent display device may have resolution deteriorated due to the transmissive area. The inventors have identified that transparent display device has a problem in that the higher the resolution, the lower the transmittance.

A transparent display device includes a plurality of signal lines and circuit areas in a non-transmissive area. As arrangement areas of the plurality of signal lines and the circuit areas are increased, a transmissive area may be reduced. For this reason, light transmittance may be reduced. In the transparent display device, it is important to reduce or minimize the arrangement areas of the plurality of signal lines and the circuit areas to obtain high light transmittance.

One or more embodiments of the present disclosure as provided by the inventors have been made in view of one or more problems in the related art including the above identified problems.

One or more embodiments of the present disclosure provide a transparent display device that may optimize arrangement areas of a plurality of signal lines and circuit areas.

It is another technical benefits of the present disclosure to provide a transparent display device that may prevent a luminance difference from occurring between subpixels for emitting light of the same color.

In addition to the technical benefits of the present disclosure as mentioned above, additional technical benefits and features of the present disclosure will be clearly understood by those skilled in the art from the following description of the present disclosure.

In accordance with an aspect of the present disclosure, the above and other technical benefits can be accomplished by the provision of a transparent display device comprising a substrate provided with transmissive areas, a first non-transmissive area provided between the transmissive areas in a first direction, and a second non-transmissive area provided between the transmissive areas in a second direction, first signal lines provided along the first non-transmissive area in the first non-transmissive area and extended from an overlapping area, in which the first non-transmissive area and the second non-transmissive area cross each other, in a direction crossing the first direction, and second signal lines provided along the second non-transmissive area in the second non-transmissive area and extended from the overlapping area in a direction crossing the second direction. Two adjacent first signal lines are symmetrical with each other with the transmissive area interposed therebetween, and two adjacent second signal lines are symmetrical with each other with the transmissive area interposed therebetween.

In accordance with another aspect of the present disclosure, the above and other technical benefits can be accomplished by the provision of a transparent display device comprising a substrate provided with transmissive areas, a first non-transmissive area provided between the transmissive areas in a first direction, and a second non-transmissive area provided between the transmissive areas in a second direction, first and second scan lines provided along the second non-transmissive area in the second non-transmissive area and extended from an overlapping area, in which the first non-transmissive area and the second non-transmissive area cross each other, in an oblique direction, a third scan line provided to be symmetrical with the second scan line with the transmissive area interposed therebetween, and a fourth scan line provided to be symmetrical with the first scan line with the transmissive area interposed therebetween.

BRIEF DESCRIPTION OF THE SEVERAL VIEWS OF THE DRAWINGS

The above and other features and other advantages of the present disclosure will be more clearly understood from the following detailed description taken in conjunction with the accompanying drawings, in which:

FIG. 5 is a view illustrating an input order of data input to a plurality of data lines and a plurality of scan lines;

DETAILED DESCRIPTION

Figure 1:
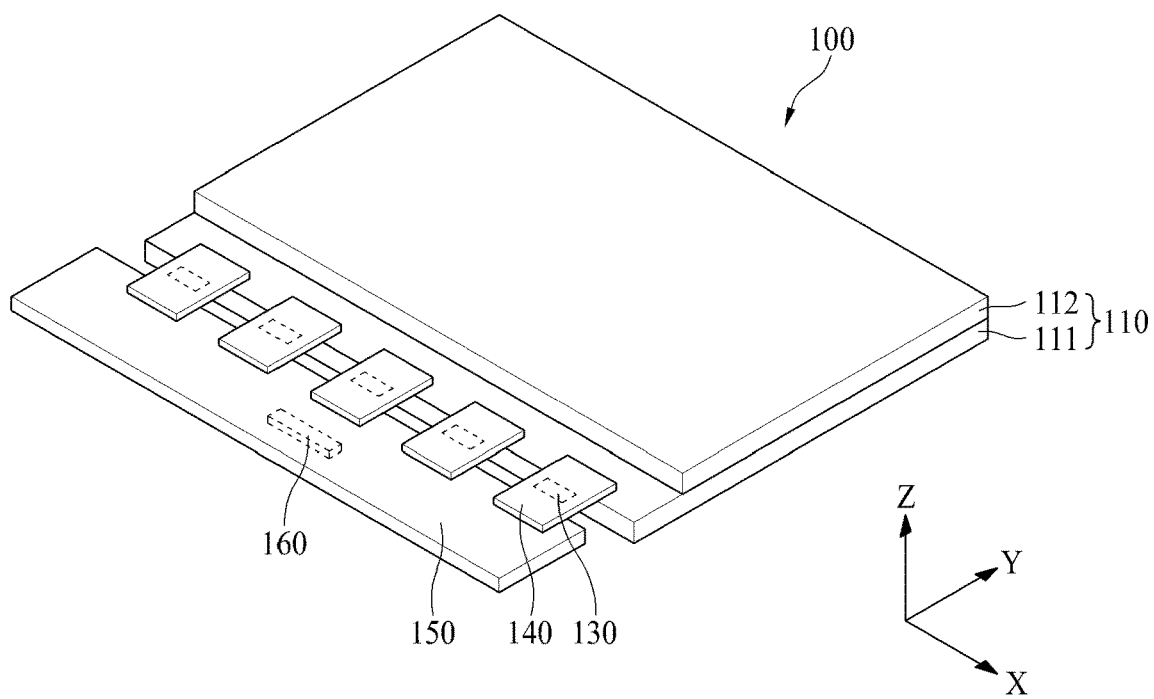
FIG. 1 is a perspective view illustrating a transparent display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a transparent display device according to the present disclosure will be described in detail with reference to the accompanying drawings. Wherever possible, the same reference numbers will be used throughout the drawings to refer to the same or like parts.

FIG. 1 is a perspective view illustrating a transparent display device according to one embodiment of the present disclosure.

Hereinafter, X axis indicates a line parallel with a scan line, Y axis indicates a line parallel with a data line, and Z axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device, a plasma display panel (PDP), a Quantum dot Light Emitting Display (QLED) or an Electrophoresis display device.

Referring to FIG. 1, the transparent display device 100 according to one embodiment of the present disclosure includes a transparent display panel 110, a source drive integrated circuit (IC) 210, a flexible film 220, a circuit board 230, and a timing controller 240.

The transparent display panel 110 includes a first substrate 111 and a second substrate 112, which face each other. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may be made of a transparent material.

The scan driver may be provided in one side of the display area of the transparent display panel 110, or the non-display area of both peripheral sides of the transparent display panel 110 by a gate driver in panel (GIP) method. In another way, the scan driver may be manufactured in a driving chip, may be mounted on the flexible film, and may be attached to one peripheral side or both peripheral sides of the display area of the transparent display panel 110 by a tape automated bonding (TAB) method.

If the source drive IC 210 is manufactured in a driving chip, the source drive IC 210 may be mounted on the flexible film 220 by a chip on film (COF) method or a chip on plastic (COP) method.

Pads, such as power pads and data pads, may be formed in the pad area PA of the transparent display panel 110. Lines connecting the pads with the source drive IC 210 and lines connecting the pads with lines of the circuit board 230 may be formed in the flexible film 220. The flexible film 220 may be attached onto the pads using an anisotropic conducting film, whereby the pads may be connected with the lines of the flexible film 220.

Figure 2:
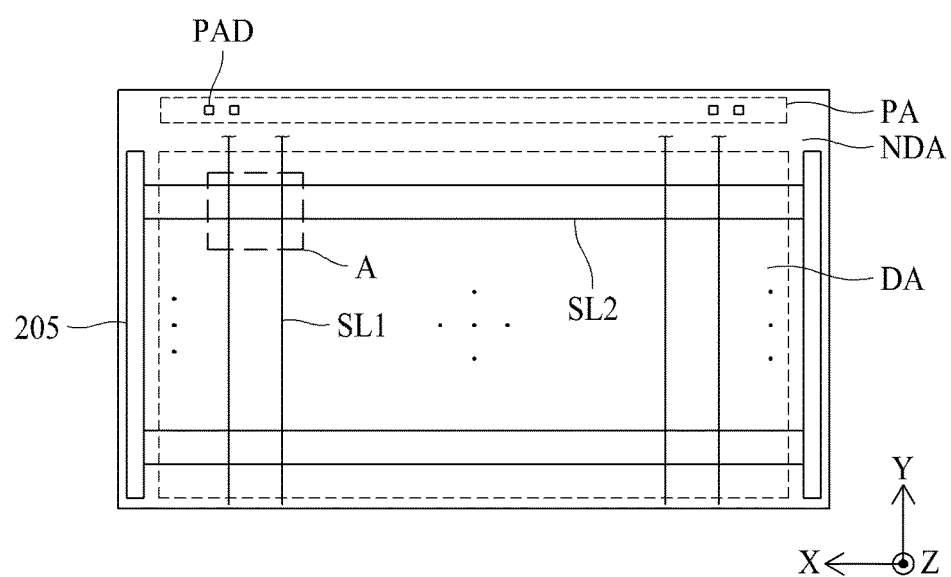
FIG. 2 is a schematic plane view illustrating a transparent display panel according to one embodiment of the present disclosure.
Figure 3:
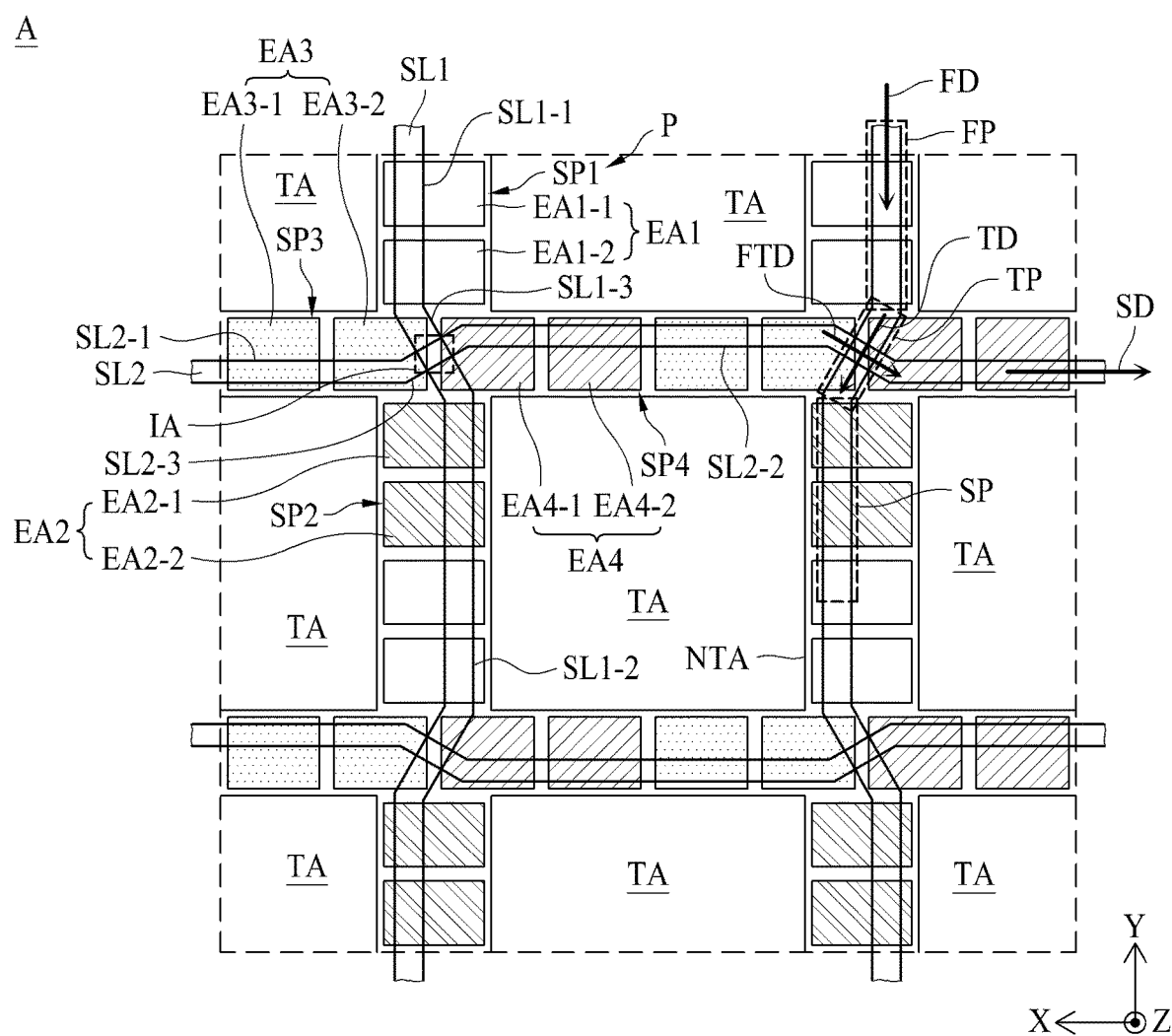
FIG. 3 is an enlarged view illustrating an area A of FIG. 2.
Figure 4:
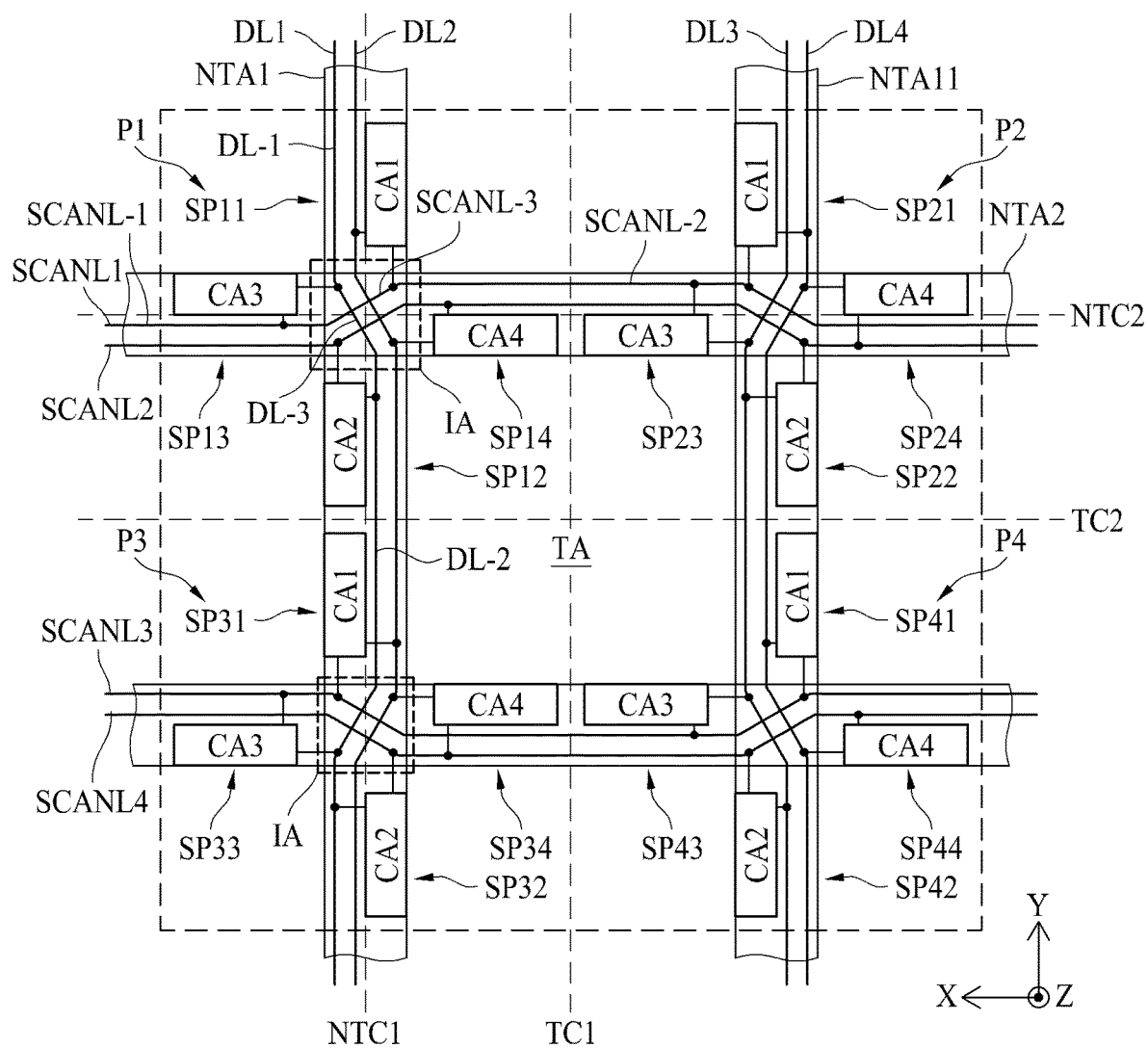
FIG. 4 is a schematic view illustrating a connection relation of signal lines and circuit areas.

FIG. 2 is a schematic plane view illustrating a transparent display panel according to one embodiment of the present disclosure, and FIG. 3 is an enlarged view illustrating an area A of FIG. 2. FIG. 4 is a schematic view illustrating a connection relation of signal lines and circuit areas, and FIG. 5 is a view illustrating an input order of data input to a plurality of data lines and a plurality of scan lines.

Referring to FIG. 2 and FIG. 5, a transparent display panel 110 may include into a display area DA provided with pixels P to display an image, and a non-display area NDA for not displaying an image.

The non-display area NDA may be provided with a pad area PA in which pads PAD are disposed, and at least one scan driver 205.

The scan driver 205 are connected to the scan lines SL and supplies scan signals to the scan lines SL. The scan driver 205 may be disposed in one side of the display area DA of the transparent display panel 110, or the non-display area NDA of both peripheral sides of the transparent display panel 110 by a gate driver in panel (GIP) method. For example, as shown in FIG. 2, the scan driver 205 may be formed in both side of the display area DA of the transparent display panel 110, but these scan drivers are not limited thereto. The scan driver 205 may be formed only in one side of the display area DA of the transparent display panel 110.

The display area DA includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than α%, for example, about 90%, and the non-transmissive area NTA may be an area where light transmittance is smaller than β%, for example, about 50%. At this time, α is greater than β. A user may view an object or background arranged over a rear surface of the transparent display panel 110 due to the transmissive area TA.

The non-transmissive area NTA may include a plurality of pixels P, and a plurality of first and second signal lines SL1 and SL2 for supplying signals to the plurality of pixels P, respectively. As shown in FIG. 4, the non-transmissive area NTA may include a first non-transmissive area NTA1 extended in a first direction (e.g., Y-axis direction) between the transmissive areas TA and a second non-transmissive area NTA2 extended in a second direction (e.g., X-axis direction) between transmissive areas TA. In some embodiments, the overlapping of one or more first non-transmissive areas NTA1 with one or more second non-transmissive areas NTA2 may form a grid-like or a lattice-like shape.

Pixels P may be provided to overlap at least one of the first signal line SL1 and the second signal line SL2, thereby emitting selected or predetermined light to display an image. An emission area EA may correspond to an area, from which light is emitted, in the pixel P.

Each of the pixels P may include at least one of a first subpixel SP1, a second subpixel SP2, a third subpixel SP3 and a fourth subpixel SP4. The first subpixel SP1 may include a first emission area EA1 emitting light of a green color. The second subpixel SP2 may include a second emission area EA2 emitting light of a red color. The third subpixel SP3 may include a third emission area EA3 emitting light of a blue color. The fourth subpixel SP4 may include a fourth emission area EA4 emitting light of a white color. However, the emission areas are not limited to this example. Each of the pixels P may further include a subpixel emitting light of a color other than red, green, blue and white. Also, the arrangement order of the subpixels SP1, SP2 and SP3 may be changed in various ways.

Light emission areas EA1, EA2, EA3 and EA4 respectively included in a plurality of subpixels SP1, SP2, SP3 and SP4 may include a plurality of divided light emission areas. In detail, the first light emission area EA1 provided in the first subpixel SP1 may include two divided areas, that is, a first divided light emission area EA1-1 and a second divided light emission area EA1-2. The second light emission area EA2 provided in the second subpixel SP2 may include two divided areas, a first divided light emission area EA2-1 and a second divided light emission area EA2-2. The third light emission area EA3 provided in the third subpixel SP3 may include two divided areas, that is, a first divided light emission area EA3-1 and a second divided light emission area EA3-2. The fourth light emission area EA4 provided in the fourth subpixel SP4 may include two divided areas, that is, a first divided light emission area EA4-1 and a second divided light emission area EA4-2.

Hereinafter, for convenience of description, the description will be given based on that a first subpixel SP1 is a green subpixel emitting green light, a second subpixel SP2 is a red subpixel emitting red light, a third subpixel SP3 is a blue subpixel emitting blue light, and a fourth subpixel SP4 is a white subpixel emitting white light.

The first subpixel SP1 and the second subpixel SP2 may be provided to overlap at least a part of the first signal line SL1, and may alternately be disposed along the first signal line SL1. The third subpixel SP3 and the fourth subpixel SP4 may be provided to overlap at least a part of the second signal line SL2 and may alternately be disposed along the second signal line SL2.

In some embodiments, the overlapping of one or more first signal lines SL1 with one or more second signal lines SL2 may form a grid-like or a lattice-like shape.

In some embodiments, the overlapping area IA includes the area where the first signal line SL1 and the second signal line SL2 cross each other. As shown in FIG. 3, the third subpixel SP3 and the fourth subpixel SP4 may be provided in an overlapping area IA where the first signal line SL1 and the second signal line SL2 cross each other. For example, EA3-2 of the third subpixel SP3 partially overlaps with the overlapping area IA and EA4-1 of the fourth subpixel SP4 partially overlaps with the overlapping area IA. Here, EA3-1 of the third subpixel SP3 and EA4-2 of the fourth subpixel SP4 is spaced apart from the overlapping area IA. In this case, the first subpixel SP1 and the second subpixel SP2 may be spaced apart from each other in the overlapping area IA with the third subpixel SP3 and the fourth subpixel SP4, which are interposed therebetween, but are not limited thereto.

In another embodiment, while not shown in FIG. 3, the first subpixel SP1 and the second subpixel SP2 may be provided in the overlapping area IA where the first signal line SL1 and the second signal line SL2 cross each other. In this case, the third subpixel SP3 and the fourth subpixel SP4 may be spaced apart from each other in the overlapping area IA with the first subpixel SP1 and the second subpixel SP2, which are interposed therebetween.

In the transparent display panel 110 according to one embodiment of the present disclosure, the first subpixel SP1 and the second subpixel SP2 may alternately be disposed along the first signal line SL1, and the third subpixel SP3 and the fourth subpixel SP4 may alternately be disposed along the second signal line SL2. Therefore, in the transparent display panel 110 according to one embodiment of the present disclosure, subpixels of the same color have a certain interval without being gathered, whereby color uniformity in view of image quality may be embodied.

The first subpixel SP1, the second subpixel SP2, the third subpixel SP3 and the fourth subpixel SP4 may respectively include circuit areas CA1, CA2, CA3 and CA4, and a light emitting diode. The circuit areas CA1, CA2, CA3 and CA4 may include a capacitor, a thin film transistor, and the like, and the thin film transistor may include a switching transistor, a sensing transistor, and a driving transistor.

In some embodiments, the first signal lines SL1 has a first portion FP, a second portion SP, and a third portion TP between the first portion and the second portion. The first portion FP and the third portion TP are continuous and contiguous to each other and the second portion SP and the third portion TP are continuous and contiguous to each other. The first portion and the second portion are arranged in the first direction FD (e.g., Y-axis) and the third portion is arranged in a third direction TD transverse to the first direction. Here, the third portion TP of the first signal line SL1 overlaps with at least one of the overlapping area among the plurality of overlapping areas.

Similarly, in some embodiments, the second signal lines SL2 includes a first portion, a second portion, and a third portion between the first portion and the second portion. The first portion and the third portion of the second signal lines SL2 are continuous and contiguous to each other and the second portion and the third portion of the second signal lines SL2 are continuous and contiguous to each other. The first portion and the second portion of the second signal lines SL2 are arranged in the second direction (e.g., X-axis). Here, the third portion is arranged in a fourth direction FTD transverse to the second direction, The third direction TD is different from the fourth direction FTD and is transverse to the third direction TD as shown in FIG. 3.

The switching transistor is switched in accordance with a scan signal supplied to a scan line to supply a data voltage supplied from a data line, to the driving transistor.

The sensing transistor may sense deviation in a threshold voltage of the driving transistor, which causes deterioration of image quality.

The driving transistor is switched in accordance with the data voltage supplied from the switching thin film transistor, generates a data current from a power source supplied from a pixel power line, and serves to supply the data current to an anode electrode of the light emitting diode. The driving transistor includes an active layer, a gate electrode, a source electrode, and a drain electrode.

The capacitor serves to maintain the data voltage supplied to the driving transistor for one frame. The capacitor may include, but is not limited to, two capacitor electrodes. In one embodiment, the capacitor may include three capacitor electrodes.

The light emitting diode may include an anode electrode, a light emitting layer, and a cathode electrode. When a voltage is applied to the anode electrode and the cathode electrode of the light emitting diode, holes and electrons move to the light emitting layer through a hole transport layer and an electron transport layer, respectively, and are combined with each other in the light emitting layer to emit light.

The plurality of first signal lines SL1 may be extended from the first non-transmissive area NTA1 along the first non-transmissive area NTA1. The plurality of first signal lines SL1 may be spaced apart from each other with the transmissive area TA interposed therebetween.

The first signal line SL1 may include a data line. In this case, the first signal line SL1 may include two data lines as shown in FIG. 4. The first signal line SL1 may include a first data line DL1 for supplying a data voltage to two of the plurality of subpixels SP1, SP2, SP3 and SP4, and a second data line DL2 for supplying a data voltage to the other two of the plurality of subpixels SP1, SP2, SP3 and SP4. For example, the first signal line SL1 may include a first data line DL1 for supplying a data voltage to the second subpixel SP2 and the third subpixel SP3, and a second data line DL2 for supplying a data voltage to the first subpixel SP1 and the fourth subpixel SP4.

Although not shown in FIG. 4, the second signal line SL2 may further include at least one of a pixel power line, a common power line, or a reference line.

The pixel power line may supply a first power source to the driving transistor of each of the subpixels SP1, SP2, SP3 and SP4 provided in the display area DA. The common power line may supply a second power source to the cathode electrodes of the subpixels SP1, SP2, SP3 and SP4 provided in the display area DA. At this time, the second power source may be a common power source commonly supplied to the subpixels SP1, SP2, SP3, SP4 and SP4. The reference line may supply an initialization voltage (or a reference voltage or a sensing voltage) to the driving transistor of each of the subpixels SP1, SP2, SP3 and SP4 provided in the display area DA.

Hereinafter, when the first signal line SL1 includes a plurality of lines, the first signal line SL1 may refer to a signal line group including a plurality of lines. For example, when the first signal line SL1 includes two data lines DL, a pixel power line, a common power line and a reference line, the first signal line SL1 may refer to a signal line group including two data lines DL, a pixel power line, a common power line, and a reference line.

The plurality of second signal lines SL2 may be extended from the second non-transmissive area NTA2 along the second non-transmissive area NTA2. The plurality of second signal lines SL2 may be spaced apart from each other with the transmissive area TA interposed therebetween.

In some embodiments, the overlapping area IA includes the area where the first non-transmissive area NTA1 and the second non-transmissive area NTA2 cross each other. As shown in FIG. 4, the plurality of second signal lines SL2 may cross the plurality of first signal lines SL1 in the overlapping area IA where the first non-transmissive area NTA1 and the second non-transmissive area NTA2 cross each other.

The second signal line SL2 may include a scan line. The second signal line SL2 may include two scan lines as shown in FIG. 4. The second signal line SL2 may include a first scan line SCANL1 for supplying a scan signal to two of the plurality of subpixels SP1, SP2, SP3 and SP4, and a second scan line SCANL2 for supplying a scan signal to the other two of the plurality of subpixels SP1, SP2, SP3 and SP4. For example, the second signal line SL2 may include a first scan line SCANL1 for supplying a scan signal to the first subpixel SP1 and the third subpixel SP3, and a second scan line SCANL2 for supplying a scan signal to the second subpixel SP2 and the fourth subpixel SP4.

Hereinafter, when the second signal line SL2 includes a plurality of lines, the second signal line SL2 may refer to a signal line group including a plurality of lines. For example, when the second signal line SL2 includes two scan lines SCANL, the second signal line SL2 may refer to a signal line group including two scan lines SCANL.

The transmissive area TA may be disposed between adjacent first signal lines SL1. In addition, the transmissive area TA may be disposed between adjacent second signal lines SL2. That is, the transmissive area TA may be surrounded by two first signal lines SL1 and two second signal lines SL2. The transmissive area TA may have a rectangular shape as shown in FIG. 3, but is not limited thereto. The transmissive area TA may have a polygonal shape, such as a hexagonal and octagonal shape, a circular shape, or an oval shape. The transmissive area TA includes a plurality of sides, and at least two subpixels may be disposed in each of the plurality of sides. For example, the transmissive area TA may include four sides as shown in FIG. 3, and two subpixels may be disposed in each of the four sides.

The transparent display panel 110 according to one embodiment of the present disclosure is characterized in that a direction in which the first signal line SL1 and the second signal line SL2 are extended is changed in the overlapping area IA.

In detail, the first signal line SL1 may be extended from the first non-transmissive area NTA1 along the first non-transmissive area NTA1. The first signal line SL1 may be extended from the first non-transmissive area NTA1 except for the overlapping area IA in the first direction (Y-axis direction), and may be extended from the overlapping area IA in a direction crossing the first direction. For example, the first signal line SL1 may be extended from the overlapping area IA in an oblique direction with respect to the first direction as shown in FIG. 3, but is not limited thereto. As another example, the first signal line SL1 may be extended from the overlapping area IA in a vertical direction with respect to the first direction.

As shown in FIG. 3, in some embodiments, the first signal line SL1 includes a portion where it is extended along a first direction (e.g., Y-axis direction). As the first signal line SL1 approaches the overlapping area IA, the first signal line SL1 is extended in a third direction TD that is different from the first direction. The first signal line SL1 may then be aligned along the first direction after the line crosses the overlapping area IA and the non-transmissive area (referred to as NTA2 in FIG. 4) arranged along a second direction (e.g., X-axis direction). Similarly, in some embodiments, the second signal line SL2 includes a portion where it is extended along the second direction. As the second signal line SL2 approaches the overlapping area IA, the second signal line SL2 is extended in a fourth direction FTD that is different from the second direction. The second signal line SL2 may then be aligned along the second direction after the line crosses the overlapping area IA and the non-transmissive area (referred to as NTA1 in FIG. 4) arranged along the first direction.

The first signal line SL1 may include a first line portion SL1-1, a second line portion SL1-2, and a connection portion SL1-3.

The first line portion SL1-1 of the first signal line SL1 may be disposed at a first side of a first non-transmissive area center line NTC1 parallel with the first direction in the first non-transmissive area NTA1. At this time, the circuit area of the subpixel may be disposed at a second side of the first non-transmissive area center line NTC1 so as to face the first line portion SL1-1 of the first signal line SL1 with the first non-transmissive area center line NTC1 interposed therebetween.

The second line portion SL1-2 of the first signal line SL1 may be disposed at the second side of the first non-transmissive area center line NTC1. At this time, the circuit area of the subpixel may be disposed on the first side of the first non-transmissive area center line NTC1 so as to face the second line portion SL1-2 of the first signal line SL1 with the first non-transmissive area center line NT1 interposed therebetween.

For example, the first line portion SL1-1 may be disposed at a left side of the first non-transmissive area center line NTC1 and extended in the first direction, and the second line portion SL1-2 may be disposed at a right side of the first non-transmissive area center line NTC1 and extended in the first direction. In this case, the connection portion SL1-3 for connecting the first line portion SL1-1 with the second line portion SL1-2 may be extended in a direction that is parallel with the first direction.

The connection portion SL1-3 of the first signal line SL1 may connect the first line portion SL1-1 with the second line portion SL1-2. The first line portion SL1-1 and the second line portion SL1-2 may alternately be disposed along the first non-transmissive area NTA1, and may be spaced apart from each other in the overlapping area IA. The connection portion SL1-3 may connect the first line portion SL1-1 and the second line portion SL1-2, which are spaced apart from each other in the overlapping area IA, with each other. Since the first line portion SL1-1 and the second line portion SL1-2 are alternately disposed along the first non-transmissive area NTA1, the connection portion SL1-3 provided in the overlapping areas IA adjacent to each other in the first direction may be extended to be opposite to each other.

Meanwhile, the connection portion SL1-3 of the first signal line SL1 may be provided only in the overlapping area IA. As shown in FIG. 3, two subpixels, for example, the second subpixel SP2 of the first pixel P1 and the first subpixel SP1 of the third pixel P3 may be provided between two overlapping areas IA adjacent to each other in the first direction. When the connection portion SL1-3 is provided between the respective subpixels, the connection portion SL1-3 may also be provided between two adjacent overlapping areas IA in addition to the overlapping area IA. The number of connection portions SL1-3 extended in the oblique direction may be increased, and consequently, a length of the first signal line SL1 is increased. For this reason, RC delay (or load) may be increased.

In addition, as the connection portion SL1-3 is extended in the oblique direction, an area where the circuit areas CA1, CA2, CA3 and CA4 may be disposed is reduced, whereby the circuit areas CA1, CA2, CA3 and CA4 may be protruded toward the transmissive area TA. As a result, the size of the transmissive area TA is reduced, whereby light transmittance is reduced.

In the transparent display panel 110 according to one embodiment of the present disclosure, the connection portion SL1-3 of the first signal line SL1 is provided only in the overlapping area IA, whereby the length of the first signal line SL1 may be reduced, and RC delay (or load) may also be reduced. In addition, in the transparent display panel 110 according to one embodiment of the present disclosure, the connection portion SL1-3 of the oblique direction is not formed between two adjacent overlapping areas IA, whereby it is possible to make sure of a sufficient space in which two of the circuit areas CA1, CA2, CA3 and CA4 will be disposed. Therefore, since the circuit areas CA1, CA2, CA3 and CA4 are not protruded toward the transmissive area TA, light transmittance may not be reduced.

The above-described first signal line SL1 may be provided in a plural number, and two first signal lines SL1 adjacent to each other in the second direction may be provided to be symmetrical with each other based on the transmissive area TA as shown in FIG. 3. In detail, the two first signal lines SL1 adjacent to each other in the second direction may be symmetrical with each other based on a first transmissive area center line TC1 passing through the center of the transmissive area TA in the first direction.

The second signal line SL2 may be extended from the second non-transmissive area NTA2 along the second non-transmissive area NTA2. The second signal line SL2 may be extended from the second non-transmissive area NTA2 except the overlapping area IA in the second direction (X-axis direction), and may be extended from the overlapping area IA in a direction crossing the second direction. For example, the second signal line SL2 may be extended from the overlapping area IA in an oblique direction with respect to the second direction as shown in FIG. 3, but is not limited thereto. For another example, the second signal line SL2 may be extended from the overlapping area IA in a vertical direction with respect to the second direction.

The second signal line SL2 may include a first line portion SL2-1, a second line portion SL2-2, and a connection portion SL2-3.

The first line portion SL2-1 of the second signal line SL2 may be disposed at a third side of a second non-transmissive area center line NTC2 parallel with the first direction in the second non-transmissive area NTA2. At this time, the circuit area of the subpixel may be disposed at a fourth side of the second non-transmissive area center line NTC2 so as to face the first line portion SL2-1 of the second signal line SL2 with the second non-transmissive area center line NTC2 interposed therebetween.

The second line portion SL2-2 of the second signal line SL2 may be disposed at the fourth side of the second non-transmissive area center line NTC2. At this time, the circuit area of the subpixel may be disposed at the third side of the second non-transmissive area center line NTC2 so as to face the second line portion SL2-2 of the second signal line SL2 with the second non-transmissive area center line NTC2 interposed therebetween.

For example, the first line portion SL2-1 may be disposed at a lower side of the second non-transmissive area center line NTC2 and extended in the second direction, and the second line portion SL2-2 may be disposed at an upper side of the second non-transmissive area center line NTC2 and extended in the second direction. In this case, the connection portion SL2-3 for connecting the first line portion SL2-1 with the second line portion SL2-2 may be extended in a direction which is not parallel with the second direction.

The connection portion SL2-3 of the second signal line SL2 may connect the first line portion SL2-1 with the second line portion SL2-2. The first line portion SL2-1 and the second line portion SL2-2 may alternately be disposed along the second non-transmissive area NTA2, and may be spaced apart from each other in the overlapping area IA. The connection portion SL2-3 may connect the first line portion SL2-1 and the second line portion SL2-2, which are spaced apart from each other in the overlapping area IA, with each other. Since the first line portion SL2-1 and the second line portion SL2-2 are alternately disposed along the second non-transmissive area NTA2, the connection portions SL2-3 provided in the overlapping areas IA adjacent to each other in the second direction may be extended to be opposite to each other.

Meanwhile, the connection portion SL2-3 of the second signal line SL2 may be provided only in the overlapping area IA. As shown in FIG. 3, two subpixels, for example, the fourth subpixel SP4 of the first pixel P1 and the third subpixel SP3 of the third pixel P3 may be disposed between the two overlapping areas IA adjacent to each other in the first direction. When the connection portion SL2-3 is provided between the respective subpixels, the connection portion SL2-3 may be provided between the two adjacent overlapping areas IA in addition to the overlapping area IA. The number of connection portions SL2-3 extended in the oblique direction is increased, and consequently, a length of the second signal line SL2 is increased. For this reason, RC delay (or load) may be increased.

In addition, as the connection portion SL2-3 is extended in the oblique direction, the area in which the circuit areas CA1, CA2, CA3 and CA4 may be disposed is reduced, whereby the circuit areas CA1, CA2, CA3 and CA4 may be protruded toward the transmissive area TA. As a result, the size of the transmissive area TA is reduced, whereby light transmittance is reduced.

In the transparent display panel 110 according to one embodiment of the present disclosure, the connection portion SL2-3 of the second signal line SL2 is provided only in the overlapping area IA, whereby the length of the second signal line SL2 may be reduced, and RC delay (or load) may also be reduced. In addition, in the transparent display panel 110 according to one embodiment of the present disclosure, the connection portion SL2-3 of the oblique direction is not formed between the two adjacent overlapping areas IA, whereby it is possible to make sure of a sufficient space in which two of the circuit areas CA1, CA2, CA3 and CA4 will be disposed. Therefore, since the circuit areas CA1, CA2, CA3 and CA4 are not protruded toward the transmissive area TA, light transmittance may not be reduced.

The above-described second signal line SL2 may be provided in a plural number, and two second signal lines SL2 adjacent to each other in the first direction may be provided to be symmetrical with each other based on the transmissive area TA as shown in FIG. 3. In detail, the two second signal lines SL2 adjacent to each other in the first direction may be symmetrical with each other based on a second transmissive area center line TC2 passing through the center of the transmissive area TA in the second direction.

Meanwhile, the first signal line SL1 may include two data lines as shown in FIG. 4, and the second signal line SL2 may include two scan lines. Therefore, the data line may have the same structure as that of the first signal line SL1 described above, and the scan line may have the same structure as that of the second signal line SL2 described above.

In detail, one first signal line SL1 may include a first data line DL1 and a second data line DL2. In addition, the other first signal line SL1 adjacent to one first signal line SL1 in the second direction may include a third data line DL1 and a fourth data line DL4.

At this time, the first data line DL1 and the second data line DL2 may be disposed in parallel along the first non-transmissive area NTA1 in the first non-transmissive area NTA1. As shown in FIG. 4, the third data line DL3 may be provided to be symmetrical with the second data line DL2 with the transmissive area TA interposed therebetween. That is, the third data line DL3 may be symmetrical with the second data line DL2 based on the first transmissive area center line TC1. The fourth data line DL4 may be provided to be symmetrical with the first data line DL1 with the transmissive area TA interposed therebetween. That is, the fourth data line DL4 may be symmetrical with the first data line DL1 based on the first transmissive area center line TC1.

Each of the first, second, third and fourth data lines DL1, DL2, DL3 and DL4 may include a first line portion DL-1, a second line portion DL-2 and a connection portion DL-3.

The first line portion DL-1 may be disposed at the first side of the first non-transmissive area center line NTC1 parallel with the first direction in the first non-transmissive area NTA1. At this time, the circuit area of the subpixel may be provided at the second side of the first non-transmissive area center line NTC1 so as to face the first line portion DL-1 with the first non-transmissive area center line NTC1 interposed therebetween.

The second line portion DL-2 may be disposed at the second side of the first non-transmissive area center line NTC1. At this time, the circuit area of the subpixel may be provided at the first side of the first non-transmissive area center line NTC1 so as to face the second line portion DL-2 with the first non-transmissive area center line NTC1 interposed therebetween.

For example, the first line portion DL-1 of each of the first data line DL1 and the second data line DL2 may be disposed at the first side of the first non-transmissive area center line NTC1. When the first line portion DL-1 of each of the first data line DL1 and the second data line DL2 overlaps at least a part of the first subpixel SP1, the first circuit area CA1 of the first subpixel SP1 may be disposed at the second side of the first non-transmissive area center line NTC1. The first circuit area CA1 of the first subpixel SP1 may face the first line portion DL-1 of each of the first data line DL1 and the second data line DL2 with the first non-transmissive area center line NTC1 interposed therebetween.

The second line portion DL-2 of each of the first data line DL1 and the second data line DL2 may be disposed at the second side of the first non-transmissive area center line NTC1. When the second line portion DL-2 of each of the first data line DL1 and the second data line DL2 overlaps at least a part of the second subpixel SP2, the second circuit area CA2 of the second subpixel SP2 may be disposed at the first side of the first non-transmissive area center line NTC1.

The second circuit area CA2 of the second subpixel SP2 may face the second line portion DL-2 of the first data line DL1 and the second data line DL2 with the first non-transmissive area center line NTC1 interposed therebetween.

Meanwhile, since the third data line DL3 and the fourth data line DL4 are symmetrical with the first data line DL1 and the second data line DL2, the second line portion DL-2 of each of the third data line DL3 and the fourth data line DL4 may be provided to face the first line portion DL-1 of each of the first data line DL1 and the second data line DL2 with the transmissive area TA interposed therebetween. Also, the first line portion DL-1 of each of the third data line DL3 and the fourth data line DL4 may be provided to face the second line portion DL-2 of each of the first data line DL1 and the second data line DL2 with the transmissive area TA interposed therebetween.

The connection portion DL-3 may connect the first line portion DL-1 with the second line portion DL-2. The first line portion DL-1 and the second line portion DL-2 may alternately be disposed along the first non-transmissive area NTA1, and may be spaced apart from each other in the overlapping area IA. The connection portion DL-3 may connect the first line portion DL-1 and the second line portion DL-2, which are spaced apart from each other in the overlapping area IA, with each other. Since the first line portion DL-1 and the second line portion DL-2 are alternately disposed along the first non-transmissive area NTA1, the connection portions DL-3 provided in the overlapping areas IA adjacent to each other in the first direction may be extended to be opposite to each other. Also, since the respective data lines DL1, DL2, DL3 and DL4 are symmetrical with each other with the transmissive area TA interposed therebetween, the connection portions DL-3 provided in the overlapping areas IA adjacent to each other in the second direction may be extended to be opposite to each other.

The connection portion DL-3 of each of the first, second, third and fourth data lines DL1, DL2, DL3 and DL4 may be provided only in the overlapping area IA. Therefore, a length of each of the first, second, third and fourth data lines DL1, DL2, DL3 and DL4 may be reduced, and RC delay (or load) may also be reduced. In addition, the connection portion DL-3 of the oblique direction is not formed between two adjacent overlapping areas IA, whereby it is possible to make sure of a sufficient space in which two of the circuit areas CA1, CA2, CA3 and CA4 will be disposed. Therefore, since the circuit areas CA1, CA2, CA3 and CA4 are not protruded toward the transmissive area TA, light transmittance may not be reduced.

Meanwhile, one second signal line SL2 may include a first scan line SCANL1 and a second scan line SCANL2, and the other first signal line SL1 adjacent thereto in the first direction may include a third scan line SCANL3 and a fourth scan line SCANL4.

At this time, the first scan line SCANL1 and the second scan line SCANL2 may be disposed in parallel along the second non-transmissive area NTA2 in the second non-transmissive area NTA2. As shown in FIG. 4, the third scan line SCANL3 may be provided to be symmetrical with the second scan line SCANL2 with the transmissive area TA interposed therebetween. That is, the third scan line SCANL3 may be symmetrical with the second scan line SCANL2 based on the second transmissive area center line TC2. The fourth scan line SCANL4 may be provided to be symmetrical with the first scan line SCANL1 with the transmissive area TA interposed therebetween. That is, the fourth scan line SCANL4 may be symmetrical with the first scan line SCANL1 based on the second transmissive area center line TC2.

Each of the first, second, third and fourth scan lines SCANL1, SCANL2, SCANL3 and SCANL4 may include a first line portion SCANL-1, a second line portion SCANL-2, and a connection portion SCANL-3.

The first line portion SCANL-1 may be disposed at the third side of the second non-transmissive area center line NTC2 parallel with the second direction in the second non-transmissive area NTA2. At this time, the circuit area of the subpixel may be provided at the fourth side of the second non-transmissive area center line NTC2 so as to face the first line portion SCANL-1 with the second non-transmissive area center line NTC2 interposed therebetween.

The second line portion SCANL-2 may be disposed at the fourth side of the second non-transmissive area center line NTC2. At this time, the circuit area of the subpixel may be provided at the third side of the second non-transmissive area center line NTC2 so as to face the second line portion SCANL-2 with the second non-transmissive area center line NTC2 interposed therebetween.

For example, the first line portion SCANL-1 of each of the first scan line SCANL1 and the second scan line SCANL2 may be disposed at the third side of the second non-transmissive area center line NTC2. When the first line portion SCANL-1 of each of the first scan line SCANL1 and the second scan line SCANL2 overlaps at least a part of the third subpixel SP3, the third circuit area CA3 of the third subpixel SP3 may be disposed at the fourth side of the second non-transmissive area center line NTC2. The third circuit area CA3 of the third subpixel SP3 may face the first line portion SCANL-1 of each of the first scan line SCANL1 and the second scan line SCANL2 with the second non-transmissive area center line NTC2 interposed therebetween.

The second line portion SCANL-2 of each of the first scan line SCANL1 and the second scan line SCANL2 may be disposed at the fourth side of the second non-transmissive area center line NTC2. When the second line portion SCANL-2 of each of the first scan line SCANL1 and the second scan line SCANL2 overlaps at least a part of the fourth subpixel SP4, the fourth circuit area CA4 of the fourth subpixel SP4 may be disposed at the third side of the second non-transmissive area center line NTC2. The fourth circuit area CA4 of the fourth subpixel SP4 may face the second line portion SCANL-2 of the first scan line SCANL1 and the second scan line SCANL2 with the second non-transmissive area center line NTC2 interposed therebetween.

Meanwhile, since the third scan line SCANL3 and the fourth scan line SCANL4 are symmetrical with the first scan line SCANL1 and the second scan line SCANL2, the second line portion SCANL-2 of each of the third scan line SCANL3 and the fourth scan line SCANL4 may be provided to face the first line portion SCANL-1 of each of the first scan line SCANL1 and the second scan line SCANL2 with the transmissive area TA interposed therebetween. Also, the first line portion SCANL-1 of each of the third scan line SCANL3 and the fourth scan line SCANL4 may be provided to face the second line portion SCANL-2 of each of the first scan line SCANL1 and the second scan line SCANL2 with the transmissive area TA interposed therebetween.

The connection portion SCANL-3 may connect the first line portion SCANL-1 with the second line portion SCANL-2. The first line portion SCANL-1 and the second line portion SCANL-2 may alternately be disposed along the second non-transmissive area NTA2, and may be spaced apart from each other in the overlapping area IA. The connection portion SCANL-3 may connect the first line portion SCANL-1 and the second line portion SCANL-2, which are spaced apart from each other in the overlapping area IA, with each other. Since the first line portion SCANL-1 and the second line portion SCANL-2 are alternately disposed along the second non-transmissive area NTA2, the connection portions SCANL-3 provided in the overlapping areas IA adjacent to each other in the second direction may be extended to be opposite to each other. Also, since the respective scan lines SCANL1, SCANL2, SCANL3 and SCANL4 are symmetrical with each other with the transmissive area TA interposed therebetween, the connection portions SCANL-3 provided in the overlapping areas IA adjacent to each other in the first direction may be extended to be opposite to each other.

The connection portion SCANL-3 of each of the first, second, third and fourth scan lines SCANL1, SCANL2, SCANL3 and SCANL4 may be provided only in the overlapping area IA. Therefore, a length of each of the first, second, third and fourth scan lines SCANL1, SCANL2, SCANL3 and SCANL4 may be reduced, and RC delay (or load) may also be reduced. In addition, the connection portion SCANL-3 of the oblique direction is not formed between two adjacent overlapping areas IA, whereby it is possible to make sure of a sufficient space in which two of the circuit areas CA1, CA2, CA3 and CA4 will be disposed. Therefore, since the circuit areas CA1, CA2, CA3 and CA4 are not protruded toward the transmissive area TA, light transmittance may not be reduced.

Two of the data lines DL1, DL2, DL3 and DL4 disposed as described above may have the same data input order, and the other two data lines may have the same data input order. In detail, the first data line DL1 and the third data line DL3 have the same data input order, and the second data line DL2 and the fourth data line DL4 may have the same data input order.

In addition, the first data line DL1 and the third data line DL3 may alternately input data (or data voltage) to two of the four subpixels SP1, SP2, SP3 and SP4. For example, each of the first data line DL1 and the third data line DL3 may alternately be connected to the second circuit area CA2 provided in the second subpixel SP2 and the third circuit area CA3 provided in the third subpixel SP3 along the first direction. That is, the first data line DL1, as shown in FIG. 4, may sequentially be connected to the third circuit area CA3 provided in the third subpixel SP3 of the first pixel P1, the second circuit area CA2 provided in the second subpixel SP2 of the first pixel P1, the third circuit area CA3 provided in the third subpixel SP3 of the third pixel P3, and the second circuit area CA2 provided in the second subpixel SP2 of the third pixel P3 along the first direction. The third data line DL3, as shown in FIG. 4, may sequentially be connected to the third circuit area CA3 provided in the third subpixel SP3 of the second pixel P2, the second circuit area CA2 provided in the second subpixel SP2 of the second pixel P2, the third circuit area CA3 provided in the third subpixel SP3 of the fourth pixel P4, and the second circuit area CA2 provided in the second subpixel SP2 of the fourth pixel P4 along the first direction.

In this case, data (or data voltage) input to the second circuit area CA2 and data (or data voltage) input to the third circuit area CA3 may alternately be input to each of the first data line DL1 and the third data line DL3 along the first direction. When the second subpixel SP2 is a blue subpixel and the third subpixel SP3 is a green subpixel, data (or data voltage) input to the green subpixel G and data (or data voltage) input to the blue subpixel B may alternately be input to each of the first data line DL1 and the third data line DL3 as shown in FIG. 5.

Meanwhile, the second data line DL2 and the fourth data line DL4 may alternately input data (or data voltage) to two of the four subpixels SP1, SP2, SP3, and SP4. For example, each of the second data line DL2 and the fourth data line DL4 may alternately be connected to the first circuit area CA1 provided in the first subpixel SP1 and the fourth circuit area CA4 provided in the fourth subpixel SP4 along the first direction. That is, the second data line DL 2, as shown in FIG. 4, may sequentially be connected to the first circuit area CA1 provided in the first subpixel SP1 of the first pixel P1, the fourth circuit area CA4 provided in the fourth subpixel SP4 of the first pixel P1, the first circuit area CA1 provided in the first subpixel SP1 of the third pixel P3, and the fourth circuit area CA4 provided in the fourth subpixel SP4 of the third pixel P3 along the first direction. The fourth data line DL4, as shown in FIG. 4, may sequentially be connected to the first circuit area CA1 provided in the first subpixel SP1 of the second pixel P2, the fourth circuit area CA4 provided in the fourth subpixel SP4 of the second pixel P2, the first circuit area CA1 provided in the first subpixel SP1 of the fourth pixel P4, and the fourth circuit area CA4 provided in the fourth subpixel SP4 of the fourth pixel P4 along the first direction.

In this case, data (or data voltage) input to the first circuit area CA1 and data (or data voltage) input to the fourth circuit area CA4 may alternately be input to each of the second data line DL2 and the fourth data line DL4 along the first direction. When the first subpixel SP1 is a white subpixel and the fourth subpixel SP4 is a red subpixel, data (or data voltage) input to the white subpixel W and data (or data voltage) input to the red subpixel R may alternately be input to each of the second data line DL2 and the fourth data line DL4 as shown in FIG. 5.

In addition, two of the scan lines SCANL1, SCANL2, SCANL3 and SCANL4 disposed as described above may have the same data input order, and the other two scan lines may have the same data input order. For example, the first scan line SCANL1 and the third scan line SCANL3 have the same data input order, and the second scan line SCANL2 and the fourth scan line SCANL4 may have the same data input order.

In addition, the first scan line SCANL1 and the third scan line SCANL3 may alternately input data (or scan signal) to two of the four subpixels SP1, SP2, SP3 and SP4. For example, each of the first scan line SCANL1 and the third scan line SCANL3 may alternately be connected to the first circuit area CA1 provided in the first subpixel SP1 and the third circuit area CA3 provided in the third subpixel SP3 along the second direction. That is, the first scan line SCANL1, as shown in FIG. 4, may sequentially be connected to the third circuit area CA3 provided in the third subpixel SP3 of the first pixel P1, the first circuit area CA1 provided in the first subpixel SP1 of the first pixel P1, the third circuit area CA3 provided in the third subpixel SP3 of the second pixel P2, and the first circuit area CA1 provided in the first subpixel SP1 of the second pixel P2 along the second direction. The third scan line SCANL3, as shown in FIG. 4, may sequentially be connected to the third circuit area CA3 provided in the third subpixel SP3 of the third pixel P3, the first circuit area CA1 provided in the first subpixel SP1 of the third pixel P3, the third circuit area CA3 provided in the third subpixel SP3 of the fourth pixel P4, and the first circuit area CA1 provided in the first subpixel SP1 of the fourth pixel P4 along the second direction.

In this case, data (or scan signal) input to the first circuit area CA1 and data (or scan signal) input to the third circuit area CA3 may alternately be input to each of the first scan line SCANL1 and the third scan line SCANL3 along the second direction. When the first subpixel SP1 is a white subpixel and the third subpixel SP3 is a green subpixel, data (or scan signal) input to the green subpixel G and data (or scan signal) input to the white subpixel W may alternately be input to each of the first scan line SCANL1 and the third scan line SCANL3 as shown in FIG. 5.

Meanwhile, the second scan line SCANL2 and the fourth scan line SCANL4 may alternately input data (or scan signal) to two of the four subpixels SP1, SP2, SP3 and SP4. For example, each of the second scan line SCANL2 and the fourth scan line SCANL4 may alternately be connected to the second circuit area CA2 provided in the second subpixel SP2 and the fourth circuit area CA4 provided in the fourth subpixel SP4 along the second direction. That is, the second scan line SCANL2, as shown in FIG. 4, may sequentially be connected to the second circuit area CA2 provided in the second subpixel SP2 of the first pixel P1, the fourth circuit area CA4 provided in the fourth subpixel SP4 of the first pixel P1, the second circuit area CA2 provided in the second subpixel SP2 of the second pixel P2, and the fourth circuit area CA4 provided in the fourth subpixel SP4 of the second pixel P2 along the second direction. The fourth scan line SCANL4, as shown in FIG. 4, may sequentially be connected to the second circuit area CA2 provided in the second subpixel SP2 of the second pixel P2, the fourth circuit area CA4 provided in the fourth subpixel SP4 of the second pixel P2, the second circuit area CA2 provided in the second subpixel SP2 of the fourth pixel P4, and the fourth circuit area CA4 provided in the fourth subpixel SP4 of the fourth pixel P4 along the second direction.

In this case, data (or scan signal) input to the second circuit area CA2 and data (or scan signal) input to the fourth circuit area CA4 may alternately be input to each of the second scan line SCANL2 and the fourth scan line SCANL4 along the second direction. When the second subpixel SP2 is a blue subpixel and the fourth subpixel SP4 is a red subpixel, data (or scan signal) input to the blue subpixel B and data (or scan signal) input to the red subpixel R may alternately be input to each of the second scan line SCANL2 and the fourth scan line SCANL4 as shown in FIG. 5.

In the transparent display panel 110 according to one embodiment of the present disclosure, the data input order of the first data line DL1 may be matched with the data input order of the third data line DL3, and the data input order of the second data line DL2 may be matched with the data input order of the fourth data line DL4. In addition, in the transparent display panel 110 according to one embodiment of the present disclosure, the data input order of the first scan line SCANL1 may be matched with the data input order of the third scan line SCANL3, and the data input order of the second scan line SCANL2 may be matched with the data input order of the fourth scan line SCANL4.

Therefore, in the transparent display panel 110 according to one embodiment of the present disclosure, the data input orders of adjacent pixels P may be matched with each other. For example, in the transparent display panel 110 according to one embodiment of the present disclosure, the data input order of the first pixel P1 may be matched with that of the second pixel P2. In addition, in the transparent display panel 110 according to one embodiment of the present disclosure, the data input order of the third pixel P3 may be matched with that of the fourth pixel P4. In this way, the transparent display panel 110 according to one embodiment of the present disclosure may simplify the algorithm by matching the data input orders of the adjacent pixels P with each other.

Meanwhile, in the transparent display panel 110 according to one embodiment of the present disclosure, data for two subpixels may alternately and repeatedly be input to each of the data lines DL1, DL2, DL3 and DL4. Therefore, in the transparent display panel 110 according to one embodiment of the present disclosure, since the previous input data (or data voltage) are always same in each of the plurality of pixels P1, P2, P3, and P4, a charging rate may be constant between the pixels P1, P2, P3 and P4.

For example, it may be assumed that the data (or data voltage) for the green subpixel G, the data (or data voltage) for the blue subpixel B, the data (or data voltage) for the white subpixel W, and the data (or data voltage) for the green subpixel G are repeatedly input to the first data line DL1.

In this case, the same data may not be input prior to the green subpixel G. In some pixels, just before data (or data voltage) are input to the green subpixel G of the corresponding pixel, data (or data voltage) may be input to the green subpixel G of another pixel. In this way, when the green subpixel G is changed to the green subpixel G, since these subpixels are those of the same color, the same data voltage may be charged in the gate node of the driving transistor. Therefore, the data voltage for driving the green subpixel G continues to be input to the corresponding pixel without change of the data voltage.

Meanwhile, in the other some pixels, just before data (or data voltage) are input to the green subpixel G of the corresponding pixel, data (or data voltage) may be input to the white subpixel W. In this way, when the white subpixel W is changed to the green subpixel G, since these subpixels are those of different colors, different data voltages may be charged in the gate node of the driving transistor. Therefore, the data voltage for driving the green subpixel G should instantaneously be input to the corresponding pixel in a state that the data voltage is not input thereto.

As described above, when colors of light emitted from the subpixels of the previous stage are different from each other, the amount of changing the data voltage may vary. When the data lines DL1, DL2, DL3 and DL4 have big RC delay, a difference in a data charging rate between the pixels may occur, whereby a luminance difference may occur between the pixels P1, P2, P3 and P4.

In the transparent display panel 110 according to one embodiment of the present disclosure, in order to prevent a luminance difference between the pixels, data for two subpixels may alternately and repeatedly be input to each of the data lines DL1, DL2, DL3 and DL4.

For example, data (or data voltage) for the green subpixel G and data (or data voltage) for the blue subpixel B may repeatedly be input to each of the first and third data lines DL1 and DL3 as shown in FIG. 5.

In this case, the same data may be input prior to the green subpixel G. That is, in all pixels, data (or data voltage) may be input to the blue subpixel B just before data (or data voltage) are input to the green subpixel G of the corresponding pixel. Also, the same data may be input prior to the blue subpixel B. In all pixels, data (or data voltage) may be input to the green subpixel G just before data (or data voltage) are input to the blue subpixel B of the corresponding pixel.

In this way, in the transparent display panel 110 according to one embodiment of the present disclosure, since the previous input data (or data voltage) are always same in each of the plurality of pixels P1, P2, P3 and P4, the data charging rate may be constant between the pixels P1, P2, P3 and P4. Therefore, in the transparent display panel 110 according to one embodiment of the present disclosure, luminance may uniformly be maintained between the pixels without a big difference.

Figure 6A:
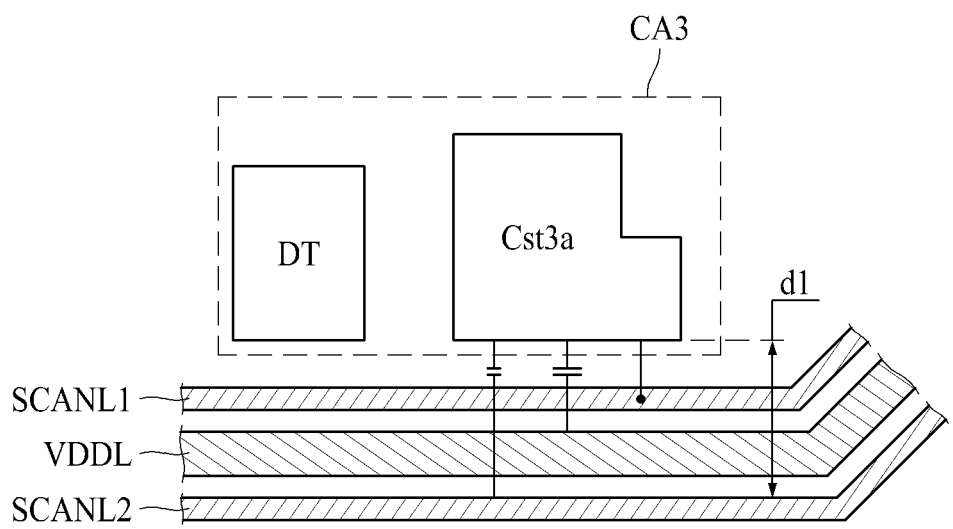
FIG. 6A is a view illustrating capacity of a capacitor of a third subpixel provided in a first pixel.
Figure 6B:
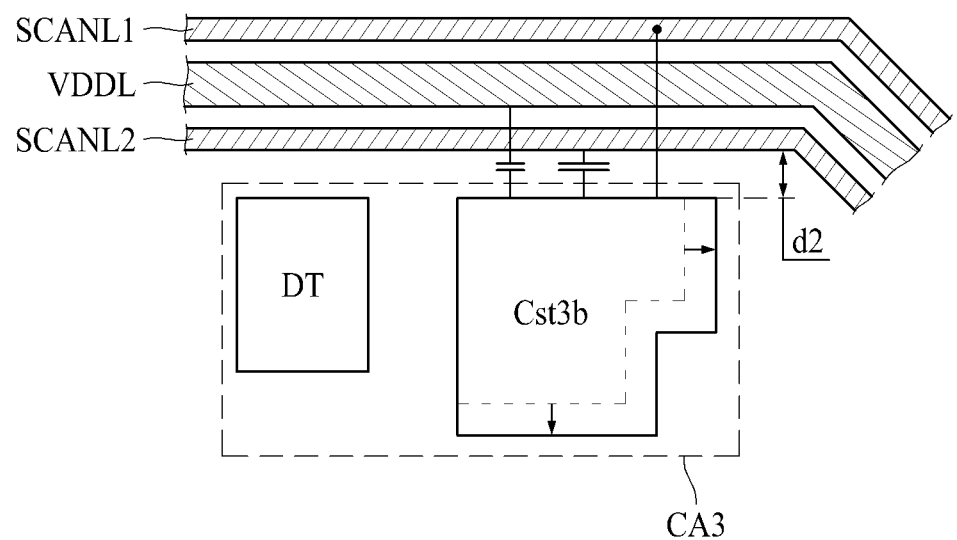
FIG. 6B is a view illustrating capacity of a capacitor of a third subpixel provided in a second pixel.
Figure 7A:
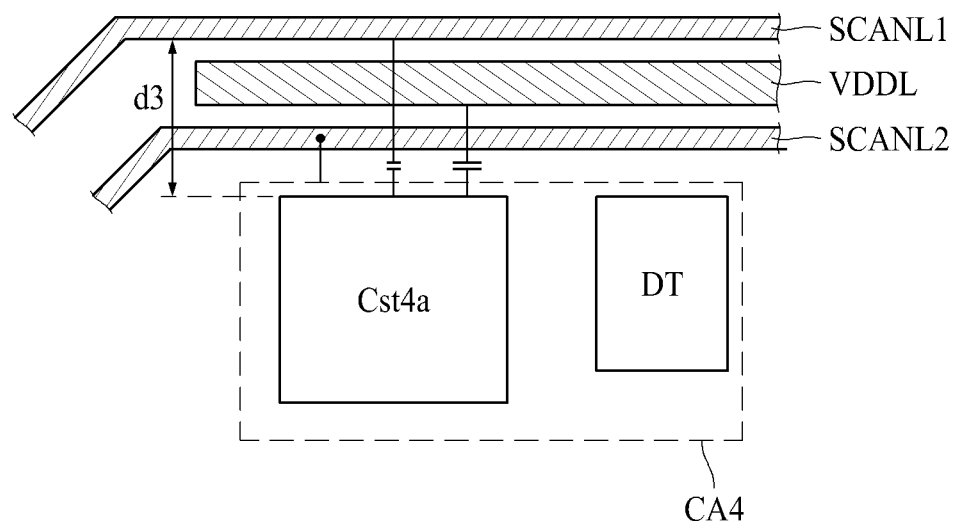
FIG. 7A is a view illustrating capacity of a capacitor of a fourth subpixel provided in a first pixel.
Figure 7B:
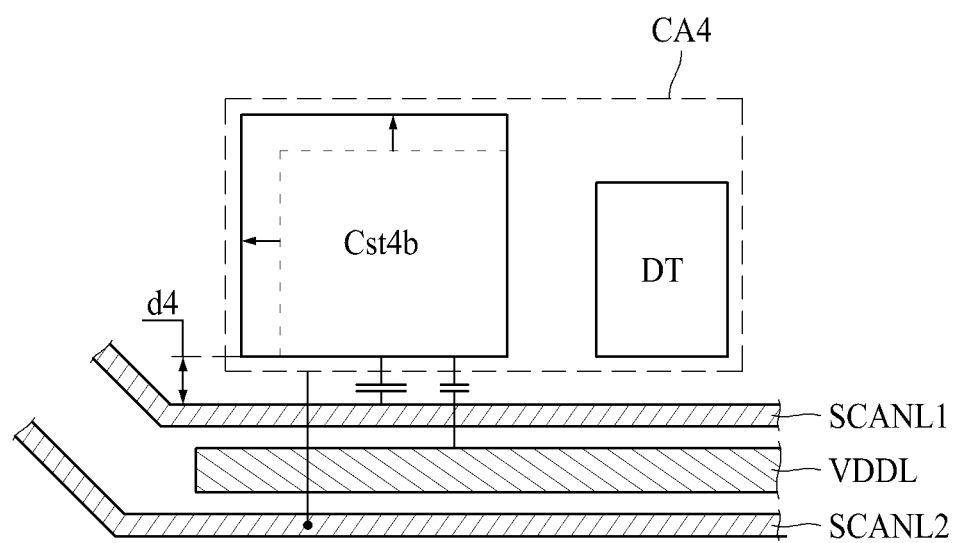
FIG. 7B is a view illustrating capacity of a capacitor of a fourth subpixel provided in a second pixel.

FIG. 6A is a view illustrating a capacitor capacity of a third subpixel provided in a first pixel, and FIG. 6B is a view illustrating a capacitor capacity of a third subpixel included in a second pixel. FIG. 7A is a view illustrating a capacitor capacity of a fourth subpixel included in a first pixel, and FIG. 7B is a view illustrating a capacitor capacity of a fourth subpixel included in a second pixel.

In the transparent display panel 110 according to one embodiment of the present disclosure, capacitors Cst of subpixels of the same color, which are provided in each of the pixels disposed to be adjacent to each other in the second direction, have their respective capacities different from each other.

Referring to FIGS. 6a and 6b, in the transparent display panel 110 according to one embodiment of the present disclosure, a capacitor Cst3a of the third subpixel SP3 provided in the first pixel P1 may have a capacity different from that of a capacitor Cst3b of the third subpixel SP3 provided in the second pixel P2.

In detail, in the first pixel P1, the third circuit area CA3 of the third subpixel SP3 may be disposed at a third side (for example, upper side) of the first scan line SCANL1 and the second scan line SCANL2. On the other hand, in the second pixel P2, the third circuit area CA3 of the third subpixel SP3 may be disposed at a fourth side (for example, lower side) of the first scan line SCANL1 and the second scan line SCANL2. Therefore, the third circuit areas CA3 respectively provided in the first pixel P1 and the second pixel P2 may have different spaced distances from the first scan line SCANL1 and the second scan line SCANL2.

When the third circuit areas CA3 respectively provided in the first pixel P1 and the second pixel P2 are connected to the same scan line, for example, the first scan line SCANL1 to receive a scan signal, a difference in a current transferred to the capacitor Cst and a transfer rate of the current may occur depending on the spaced distance from the second scan line SCANL2. The smaller the distance between the second scan line SCANL2 and the capacitor Cst is, the greater parasitic capacitance is, and the current transferred to the capacitor Cst and the transfer rate of the current may be reduced.

The third circuit area CA3 of the first pixel P1 may be disposed to be adjacent to the first scan line SCANL1, and may be spaced apart from the second scan line SCANL2 with the first scan line SCANL1 and the pixel power line VDDL, which are interposed therebetween. At this time, the third circuit area CA3 of the first pixel P1 may be spaced apart from the second scan line SCANL2 as much as a first distance d1.

On the other hand, the third circuit area CA3 of the second pixel P2 may be disposed to be adjacent to the second scan line SCANL2, and may be spaced apart from the first scan line SCANL1 with the second scan line SCANL2 and the pixel power line VDDL, which are interposed therebetween. At this time, the third circuit area CA3 of the second pixel P2 may be spaced apart from the second scan line SCANL2 as much as a second distance d2 that is smaller than the first distance d1.

That is, the third circuit area CA3 of the second pixel P2 has a smaller spaced distance from the second scan line SCANL2 than that of the third circuit area CA3 of the first pixel P1. Therefore, parasitic capacitance between the capacitor Cst3b of the second pixel P2 and the second scan line SCANL2 is greater than that between the capacitor Cst3a of the first pixel P1 and the second scan line SCANL2. When the capacitor Cst3b of the second pixel P2 has the same capacity as that of the capacitor Cst3a of the first pixel P1, the third subpixel SP3 of the second pixel P2 and the third subpixel SP3 of the first pixel P1 generate a difference in a current transferred to the capacitors Cst3a and Cst3b and a transfer rate of the current due to a difference in parasitic capacitance, thereby resulting in a luminance difference.

In the transparent display panel 110 according to one embodiment of the present disclosure, the capacity of the capacitor Cst3b of the second pixel P2 having a large parasitic capacitance due to a small spaced distance from the second scan line SCANL2 may be increased in order to prevent a luminance difference from occurring between the third subpixels SP3. That is, the capacitor Cst3b of the second pixel P2 may have a larger capacity than that of the capacitor Cst3a of the first pixel P1 having a large spaced distance from the second scan line SCANL2.

In the transparent display panel 110 according to one embodiment of the present disclosure, the capacitor Cst3b of the third subpixel SP3 having a large parasitic capacitance is formed with an area larger than that of the capacitor Cst3a of the third subpixel SP3 having a small parasitic capacitance, whereby the difference in the current and the transfer rate of the current between the third subpixels SP3 may be reduced, and, consequently, the luminance difference may be reduced.

Meanwhile, the parasitic capacitance may also occur between the pixel power line VDDL and the capacitor Cst. However, the third circuit areas CA3 provided in the first pixel P1 and the second pixel P2 have the same spaced distance from the pixel power line VDDL, and thus may have the same parasitic capacitance with the pixel power line VDDL. Therefore, the parasitic capacitance between the pixel power line VDDL and the capacitor Cst may not affect the luminance difference between the third subpixels SP3.

Referring to FIGS. 7a and 7b, in the transparent display panel 110 according to one embodiment of the present disclosure, a capacitor Cst4a of the fourth subpixel SP4 provided in the first pixel P1 may have a capacity different from that of a capacitor Cst4b of the fourth subpixel SP4 provided in the second pixel P2.

In detail, in the first pixel P1, the fourth circuit area CA4 of the fourth subpixel SP4 may be disposed at the fourth side (for example, lower side) of the first scan line SCANL1 and the second scan line SCANL2. On the other hand, in the second pixel P2, the fourth circuit area CA4 of the fourth subpixel SP4 may be disposed at the third side (for example, upper side) of the first scan line SCANL1 and the second scan line SCANL2. Therefore, the fourth circuit areas CA4 respectively provided in the first pixel P1 and the second pixel P2 may have different spaced distances from the first scan line SCANL1 and the second scan line SCANL2.

When the fourth circuit areas CA4 respectively provided in the first pixel P1 and the second pixel P2 are connected to the same scan line, for example, the second scan line SCANL2, to receive a scan signal, a difference in a current transferred to the capacitor Cst and a transfer rate of the current may occur depending on the spaced distance from the first scan line SCANL1. The smaller the distance between the first scan line SCANL1 and the capacitor Cst is, the greater parasitic capacitance is, and the current transferred to the capacitor Cst and the transfer rate of the current may be reduced.

The fourth circuit area CA4 of the first pixel P1 may be disposed to be adjacent to the second scan line SCANL2, and may be spaced apart from the first scan line SCANL1 with the second scan line SCANL2 and the pixel power line VDDL, which are interposed therebetween. At this time, the fourth circuit area CA4 of the first pixel P1 may be spaced apart from the first scan line SCANL1 as much as a third distance d3.

On the other hand, the fourth circuit area CA4 of the second pixel P2 may be disposed to be adjacent to the first scan line SCANL1, and may be spaced apart from the second scan line SCANL2 with the first scan line SCANL1 and the pixel power line VDDL, which are interposed therebetween. At this time, the fourth circuit area CA4 of the second pixel P2 may be spaced apart from the first scan line SCANL1 as much as a fourth distance d4 that is smaller than the third distance d3.

That is, the fourth circuit area CA4 of the second pixel P2 has a smaller spaced distance from the first scan line SCANL1 than that of the fourth circuit area CA4 of the first pixel P1. Therefore, parasitic capacitance between the capacitor Cst4$b$ of the second pixel P2 and the first scan line SCANL1 is greater than that between the capacitor Cst4$a$ of the first pixel P1 and the first scan line SCANL1. When the capacitor Cst4$b$ of the second pixel P2 has the same capacity as that of the capacitor Cst4$a$ of the first pixel P1, the fourth subpixel SP4 of the second pixel P2 and the fourth subpixel SP4 of the first pixel P1 generate a difference in a current transferred to the capacitors Cst4$a$ and Cst4$b$ and a transfer rate of the current due to a difference in parasitic capacitance, thereby resulting in a luminance difference.

In the transparent display panel 110 according to one embodiment of the present disclosure, the capacity of the capacitor Cst4$b$ of the second pixel P2 having a large parasitic capacitance due to a small spaced distance from the first scan line SCANL1 may be increased in order to prevent a luminance difference from occurring between the fourth subpixels SP4. That is, the capacitor Cst4$b$ of the second pixel P2 may have a larger capacity than that of the capacitor Cst4$a$ of the first pixel P1 having a large spaced distance from the first scan line SCANL1.

In the transparent display panel 110 according to one embodiment of the present disclosure, the capacitor Cst4$b$ of the fourth subpixel SP4 having a large parasitic capacitance is formed with an area larger than that of the capacitor Cst4$a$ of the fourth subpixel SP4 having a small parasitic capacitance, whereby the difference in the current and the transfer rate of the current between the fourth subpixels SP4 may be reduced, and, consequently, the luminance difference may be reduced.

Meanwhile, the parasitic capacitance may also occur between the pixel power line VDDL and the capacitor Cst. However, the fourth circuit areas CA4 respectively provided in the first pixel P1 and the second pixel P2 have the same spaced distance from the pixel power line VDDL, and thus may have the same parasitic capacitance with the pixel power line VDDL. Therefore, the parasitic capacitance between the pixel power line VDDL and the capacitor Cst may not affect the luminance difference between the fourth subpixels SP4.

According to the present disclosure, the following advantageous effects may be obtained.

The present disclosure may propose a pixel structure capable of increasing or maximizing a transmissive area and reducing or minimizing a non-transmissive area, thereby increasing or maximizing light transmittance. The present disclosure may prevent a length of a plurality of signal lines from being increased in disposing the plurality of signal lines and circuit areas in the reduced or minimized non-transmissive area, and may prevent light transmittance from being reduced by the circuit areas by disposing the circuit areas so as not to be protruded toward the transmissive area.

In addition, in the proposed pixel structure of the present disclosure, data for two subpixels may alternately and repeatedly be input to each of the data lines. In the present disclosure, the previous input data (or data voltage) are always same in each of the plurality of pixels, whereby a difference in the data charging rate and a luminance difference may be prevented from occurring between the pixels.

In addition, in the proposed pixel structure of the present disclosure, the capacitances of the capacitors are differentially designed in consideration of the difference in parasitic capacitance, whereby a luminance difference may be prevented from occurring between the subpixels emitting light of the same color.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is intended to cover all variations or modifications.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display device comprising:
 a substrate having thereon transmissive areas, a first non-transmissive area provided between the transmissive areas in a first direction, and a second non-transmissive area provided between the transmissive areas in a second direction
 an overlapping area where the first non-transmissive area and the second non-transmissive area overlap each other;
 first signal lines provided along the first non-transmissive area and extending in the overlapping area in a direction crossing the first direction; and
 second signal lines provided along the second non-transmissive area and extending in the overlapping area in a direction crossing the second direction,
 wherein two adjacent first signal lines are symmetrical with each other with the transmissive area interposed therebetween, and two adjacent second signal lines are symmetrical with each other with the transmissive area interposed therebetween,
 wherein the first signal line includes a first line portion disposed at a first side of a first non-transmissive area center line parallel with the first direction in the first non-transmissive area, a second line portion disposed at a second side of the first non-transmissive area center line, and a connection portion coupling the first line portion with the second line portion in the overlapping, area.

2. The transparent display device of claim 1, wherein the two adjacent first signal lines are symmetrical with each other with respect to the first transmissive area center line passing through a center of the transmissive area in the first direction, and the two adjacent second signal lines are symmetrical with each other with respect to the second transmissive area center line passing through the center of the transmissive area in the second direction.

3. The transparent display device of claim 1, wherein the connection portion of the first signal line is provided only in the overlapping area.

4. The transparent display device of claim 1, further comprising circuit areas disposed with the first line portion of the first signal line and the first non-transmissive area center line, which are interposed therebetween, or disposed with the second line portion of the first signal line and the first non-transmissive area center line, which are interposed therebetween.

5. The transparent display device of claim 1, wherein the second signal line includes a first line portion disposed at a third side of a second non-transmissive area center line parallel with the second direction in the second non-transmissive area, a second line portion disposed at a fourth side of the second non-transmissive area center line, and a connection portion coupling the first line portion with the second line portion in the overlapping area.

6. The transparent display device of claim 5, wherein the connection portion of the second signal line is provided only in the overlapping area.

7. The transparent display device of claim 5, further comprising circuit areas disposed with the first line portion of the second signal line and the second non-transmissive area center line, which are interposed therebetween, or disposed with the second line portion of the second signal line and the second non-transmissive area center line, which are interposed therebetween.

8. The transparent display device of claim 1, further comprising:
first and second subpixels alternately disposed along the first signal line; and
third and fourth subpixels alternately disposed along the second signal line.

9. The transparent display device of claim 8, wherein the first signal line includes:
a first data line supplying a data voltage to the second subpixel and the third subpixel; and
a second data line supplying a data voltage to the first subpixel and the fourth subpixel.

10. The transparent display device of claim 9, wherein the first data line is alternately coupled to a second circuit area provided in the second subpixel and a third circuit area provided in the third subpixel along the first direction, and the second data line is alternately coupled to a first circuit area provided in the first subpixel and a fourth circuit area provided in the fourth subpixel along the first direction.

11. The transparent display device of claim 8, wherein the second signal line includes:
a first scan line supplying a scan signal to the first subpixel and the third subpixel; and
a second scan line supplying a scan signal to the second subpixel and the fourth subpixel.

12. The transparent display device of claim 11, wherein the first scan line is alternately coupled to a first circuit area provided in the first subpixel and a third circuit area provided in the third subpixel along the second direction, and the second scan line is alternately coupled to a second circuit area provided in the second subpixel and a fourth circuit area provided in the fourth subpixel along the second direction.

13. The transparent display device of claim 12, wherein each of the first to fourth circuit areas includes a capacitor, two third circuit areas disposed to be adjacent to each other in the second direction include capacitors having their respective capacities different from each other, and two fourth circuit areas disposed to be adjacent to each other in the second direction include capacitors having their respective capacities different from each other.

14. The transparent display device of claim 12, wherein two third circuit areas disposed to be adjacent to each other in the second direction have different spaced distances from the second scan line, and two fourth circuit areas disposed to be adjacent to each other in the second direction have different spaced distances from the first scan line.

15. A transparent display device comprising:
a substrate having thereon transmissive areas, a first non-transmissive area provided between the transmissive areas in a first direction, and a second non-transmissive area provided between the transmissive areas in a second direction;
first and second scan lines provided along the second non-transmissive area in the second non-transmissive area and extended from an overlapping area, in which the first non-transmissive area and the second non-transmissive area overlap each other, in an oblique direction;
a third scan line provided to be symmetrical with the second scan line with the transmissive area interposed therebetween; and
a fourth scan line provided to be symmetrical with the first scan line with the transmissive area interposed therebetween.

16. The transparent display device of claim 15, further comprising:
first and second data lines provided along the first non-transmissive area in the first non-transmissive area and extended from the overlapping area in the oblique direction;
a third data line provided to be symmetrical with the second data line with the transmissive area interposed therebetween; and
a fourth data line provided to be symmetrical with the first data line with the transmissive area interposed therebetween.

17. The transparent display device of claim 16, wherein each of the first to fourth data lines includes a first line portion disposed at a first side of a first non-transmissive area center line parallel with the first direction in the first non-transmissive area, a second line portion disposed at a second side of the first non-transmissive area center line, and a connection portion coupling the first line portion with the second line portion in the overlapping area, and the connection portion is provided only in the overlapping area.

18. The transparent display device of claim 15, wherein each of the first to fourth scan lines includes a first line portion disposed at a third side of a second non-transmissive area center line parallel with the second direction in the second non-transmissive area, a second line portion disposed at a fourth side of the second non-transmissive area center line, and a connection portion coupling the first line portion with the second line portion in the overlapping area, and the connection portion is provided only in the overlapping area.

19. The transparent display device of claim 15, further comprising:
first and second subpixels alternately disposed in the first non-transmissive area along the first direction;
third and fourth subpixels alternately disposed in the second non-transmissive area along the second direction;
a first circuit area provided in the first subpixel;
a second circuit area provided in the second subpixel;
a third circuit area provided in the third subpixel; and
a fourth circuit area provided in the fourth subpixel,
wherein the first to fourth subpixels emit light of different colors.

20. The transparent display device of claim 19, wherein each of the first scan line and the third scan line is alternately coupled to the first circuit area and the third circuit area along the second direction, and each of the second scan line and the fourth scan line is alternately coupled to the second circuit area and the fourth circuit area along the second direction.

21. The transparent display device of claim 20, wherein two third circuit areas disposed to be adjacent to each other in the second direction have different spaced distances from the second scan line, and two fourth circuit areas disposed to be adjacent to each other in the second direction have different spaced distances from the first scan line.

22. The transparent display device of claim 20, wherein each of the first to fourth circuit areas includes a capacitor, two third circuit areas disposed to be adjacent to each other in the second direction include capacitors having their respective capacities different from each other, and two fourth circuit areas disposed to be adjacent to each other in the second direction include capacitors having their respective capacities different from each other.

23. The transparent display device of claim 22, wherein the capacitor of the third circuit area having a first spaced distance from the second scan line in the two third circuit areas disposed to be adjacent to each other in the second direction has a capacity greater than that of the third circuit area having a second spaced distance from the second scan line, and
the capacitor of the fourth circuit area having a third spaced distance from the first scan line in the two fourth circuit areas disposed to be adjacent to each other in the second direction has a capacity greater than that of the fourth circuit area having a fourth spaced distance from the first scan line,
wherein the second spaced distance is greater than the first spaced distance, and
wherein the fourth spaced distance is greater than the third spaced distance.

24. A device comprising:
a plurality of transmissive areas arranged along a first direction and a second direction transverse to the first direction;
a plurality of first non-transmissive areas provided between the transmissive areas in the first direction;
a plurality of second non-transmissive areas provided between the transmissive areas in the second direction;
a plurality of overlapping areas where the plurality of first non-transmissive areas overlap with the plurality of second non-transmissive area; and
first signal lines provided on the first non-transmissive areas, the first signal lines having a first portion, a second portion, and a third portion between the first portion and the second portion, the first portion and the second portion arranged in the first direction, the third portion arranged in a third direction transverse to the first direction,
wherein the third portion of the first signal line overlaps with at least one of the overlapping area among the plurality of overlapping areas.

25. The device of claim 24, wherein the plurality of first non-transmissive areas overlap with the plurality of second non-transmissive area to form a lattice-like shape, and
wherein each of the transmissive area of the plurality of transmissive areas is disposed in areas formed between adjacent first non-transmissive areas and adjacent second non-transmissive areas.

26. The device of claim 24, further comprising:
second signal lines provided on the second non-transmissive areas, the second signal lines having a first portion, a second portion, and a third portion between the first portion and the second portion, the first portion and the second portion arranged in the second direction, the third portion arranged in a fourth direction transverse to the second direction,
wherein the third direction is different from the fourth direction.

27. The device of claim 26, wherein the first signal lines include a first data line, a second data line, a third data line, and a fourth data line,
wherein the first and second data lines are arranged in one of the first non-transmissive areas and the third and fourth data lines are arranged in another first non-transmissive area,
wherein the first data line and the fourth data line are symmetrical with each other with respect to a transmissive area between the one of the first non-transmissive area and the another first non-transmissive area, and
wherein the second data line and the third data line are symmetrical with each other with respect to the transmissive area between the one of the first non-transmissive area and the another first non-transmissive area.

28. The device of claim 27, wherein the second signal lines include a first scan line, a second scan line, a third scan line, and a fourth scan line,
wherein the first and second scan lines are arranged in one of the second non-transmissive areas and the third and fourth scan lines are arranged in another second non-transmissive area,
wherein the first scan line and the fourth scan line are symmetrical with each other with respect to a transmissive area between the one of the second non-transmissive area and the another second non-transmissive area, and
wherein the second scan line and the third scan line are symmetrical with each other with respect to the transmissive area between the one of the second non-transmissive area and the another second non-transmissive area.

29. The device of claim 24, wherein the second signal lines include a first scan line, a second scan line, a third scan line, and a fourth scan line, the device further comprising:
a first circuit area configured to control a first subpixel arranged in the first direction of the first non-transmissive area, wherein the first circuit area is coupled to the second data line and the first scan line; and
a second circuit area configured to control a second subpixel arranged in the first direction of the first non-transmissive area, wherein the second circuit area is coupled to the first data line and the second scan line, wherein the first circuit area and the second circuit area are symmetrical to each other with respect to an overlapping area among the plurality of overlapping areas.

30. The device of claim 24, wherein the second signal lines include a first scan line, a second scan line, a third scan line, and a fourth scan line, the device further comprising:
a third circuit area configured to control a third subpixel arranged in the second direction of the second non-transmissive area, wherein the second circuit area is coupled to the first data line and the first scan line; and
a fourth circuit area configured to control a fourth subpixel arranged in the second direction of the second non-transmissive area, wherein the fourth circuit area is coupled to the second data line and the second scan line,
wherein the third circuit area and the fourth circuit area are symmetrical to each other with respect to the overlapping area among the plurality of overlapping areas.

* * * * *